United States Patent
Lee et al.

(10) Patent No.: US 6,198,651 B1
(45) Date of Patent: Mar. 6, 2001

(54) FERROELECTRIC MEMORY DEVICES WHICH UTILIZE BOOSTED PLATE LINE VOLTAGES TO IMPROVE READING RELIABILITY AND METHODS OF OPERATING SAME

(75) Inventors: Jin-Woo Lee; Dong-Jin Jung; Ki-Nam Kim, all of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/149,366

(22) Filed: Sep. 8, 1998

(30) Foreign Application Priority Data

Sep. 8, 1997 (KR) .................................. 97-46199

(51) Int. Cl.⁷ .................................................. G11C 11/22
(52) U.S. Cl. ........................................... 365/145; 365/149
(58) Field of Search ..................................... 365/145, 149

(56) References Cited

U.S. PATENT DOCUMENTS

| 4,809,225 | 2/1989 | Dimmler et al. | 365/145 |
| 4,873,664 | 10/1989 | Eaton, Jr. | 365/145 |
| 4,888,733 | 12/1989 | Mobley | 365/145 |

(List continued on next page.)

FOREIGN PATENT DOCUMENTS

| 0278167A2 | 8/1988 | (EP) . |
| 0293798A2 | 12/1988 | (EP) . |
| 0359404A2 | 3/1990 | (EP) . |
| 0709851A2 | 5/1996 | (EP) . |
| 0740304A2 | 10/1996 | (EP) . |
| 0749127A2 | 12/1996 | (EP) . |
| 0759620A2 | 2/1997 | (EP) . |
| 0766253 A2 | 4/1997 | (EP) . |

OTHER PUBLICATIONS

The Patent Office, Search Report under Section 17(5), British Patent Office, dated Oct. 16, 1997.
The Patent Office, Search Report under Section 17(5), British Patent Office, dated Nov. 6, 1997.

* cited by examiner

Primary Examiner—David Nelms
Assistant Examiner—M. Tran
(74) Attorney, Agent, or Firm—Myers Bigel Sibley & Sajovec

(57) ABSTRACT

Ferroelectric memory devices include a plate line, a bit line, a ferroelectric memory cell containing a first access transistor and a first ferroelectric capacitor electrically connected in series between the bit line and the plate line, and a word line electrically connected to a gate electrode of the first access transistor. A row decoder and a preferred plate line pulse generator are also provided to generate a write voltage of first magnitude (e.g., Vcc) on the plate line during a write time interval and a read voltage of a second magnitude (e.g., Vcc+α), greater than the first magnitude, on the plate line during a read time interval. These different magnitudes of the write and read voltage for the plate line are generated in response to a control signal (CP), so that during a read operation, the magnitude of the change in voltage across the ferroelectric capacitor will be sufficient to enable a complete charge transfer of $2Q_R$ when the ferroelectric memory cell is storing a data 1 value. The plate line pulse generator may comprise a pulse generator, a voltage boosting circuit having an input electrically coupled to an output of the pulse generator and a switch circuit to electrically couple an output of the pulse generator to an output of the plate line pulse generator when the control signal is in a first logic state (during a write operation) and electrically couple an output of the voltage boosting circuit to the output of the plate line pulse generator when the control signal is in a second logic state (during a read operation).

11 Claims, 3 Drawing Sheets

U.S. PATENT DOCUMENTS

| | | | |
|---|---|---|---|
| 5,038,323 | 8/1991 | Schwee | 365/145 |
| 5,086,412 | 2/1992 | Jaffe et al. | 365/145 |
| 5,262,982 | 11/1993 | Brassington et al. | 365/145 |
| 5,273,927 | 12/1993 | Gnadinger | 437/52 |
| 5,297,077 | 3/1994 | Imai et al. | 365/145 |
| 5,300,799 | 4/1994 | Nakamura et al. | 257/295 |
| 5,345,414 | 9/1994 | Nakamura | 365/145 |
| 5,350,705 | 9/1994 | Brassington et al. | 257/295 |
| 5,371,699 | 12/1994 | Larson | 365/145 |
| 5,373,463 | 12/1994 | Jones, Jr. | 365/145 |
| 5,400,275 * | 3/1995 | Abe et al. | 365/145 |
| 5,412,596 | 5/1995 | Hoshiba | 365/145 |
| 5,414,654 | 5/1995 | Kubota et al. | 365/145 |
| 5,424,975 | 6/1995 | Lowrey et al. | 365/145 |
| 5,487,029 | 1/1996 | Kuroda | 365/145 |
| 5,532,953 | 7/1996 | Ruesch et al. | 365/145 |
| 5,541,870 | 7/1996 | Mihara et al. | 365/145 |
| 5,541,871 | 7/1996 | Nishimura et al. | 365/145 |
| 5,550,770 | 8/1996 | Kuroda | 365/145 |
| 5,579,257 | 11/1996 | Tai | 365/145 |
| 5,598,366 | 1/1997 | Kraus et al. | 365/145 |
| 5,600,587 | 2/1997 | Koike | 365/145 |
| 5,608,667 | 3/1997 | Osawa | 365/145 |
| 5,615,144 | 3/1997 | Kimura et al. | 365/145 |
| 5,615,145 | 3/1997 | Takeuchi et al. | 365/145 |
| 5,619,470 | 4/1997 | Fukumoto | 365/228 |
| 5,638,318 | 6/1997 | Seyyedy | 365/145 |
| 5,640,030 | 6/1997 | Kenney | 257/296 |
| 5,640,345 | 6/1997 | Okuda et al. | 365/184 |
| 5,675,530 | 10/1997 | Hirano et al. | 365/145 |
| 5,675,536 | 10/1997 | Sim | 365/185.22 |
| 5,675,537 | 10/1997 | Bill et al. | 365/185.22 |
| 5,751,626 | 5/1998 | Seyyedy | 365/145 |

FERROELECTRIC MEMORY DEVICES WHICH UTILIZE BOOSTED PLATE LINE VOLTAGES TO IMPROVE READING RELIABILITY AND METHODS OF OPERATING SAME

FIELD OF THE INVENTION

The present invention relates to integrated circuit memory devices, and more particularly to nonvolatile integrated circuit memory devices and methods of operating nonvolatile integrated circuit memory devices.

BACKGROUND OF THE INVENTION

Ferroelectric random access memory (FRAM) devices are "nonvolatile" memory devices because they preserve data stored therein even in the absence of a power supply signal. A FRAM device may comprise an array of ferroelectric memory cells and each ferroelectric memory cell in the array may be electrically coupled to a corresponding plate line PL, a corresponding word line WL and a corresponding bit line BL. Each ferroelectric memory cell may comprise an NMOS access transistor Tr and a ferroelectric capacitor $C_F$ electrically connected in series between a corresponding bit line BL and plate line PL, as illustrated by FIG. 1. In addition, first and second electrodes of the ferroelectric capacitor $C_F$ may be electrically connected to a first source/drain region of the access transistor Tr and the plate line PL, respectively, a second source/drain region of the access transistor Tr may be electrically connected to a corresponding bit line BL and a gate electrode of the access transistor Tr may be electrically connected to a corresponding word line WL. The effective capacitance between the first source/drain region of the access transistor Tr and the ferroelectric capacitor $C_F$ may also be designated as $C_{jun}$ and the effective capacitance of the bit line BL may be designated as $C_{BL}$. Typical FRAM devices are also described in an article by J. T. Evans, entitled "An Experimental 512-Bit Nonvolatile Memory with Ferroelectric Storage Cells", IEEE Journal of Solid-State Circuits, Vol. 23, No. 5, pp. 1171–1175, October (1988).

The nonvolatile nature of a ferroelectric memory cell is a direct consequence of using a ferroelectric material as the dielectric of the cell's capacitor. Typical ferroelectric materials which can be used for the ferroelectric capacitor include Phase III potassium nitrate, bismuth titanate and lead zirconate titanate Pb(Zr, Ti)O$_3$ (PZT). Because these ferroelectric materials possess hysteresis characteristics, the polarity (i.e., state) of the ferroelectric material can be maintained even after interruption of the power supply. Thus, data (e.g., logic 0,1) can be stored in the FRAM as the polarity state of the ferroelectric material in each capacitor.

The typical hysteresis characteristics of a ferroelectric material will now be described in detail with reference to FIG. 2. In FIG. 2, the abscissa represents a voltage V applied across the first and second electrodes of the ferroelectric capacitor, and the ordinate represents an amount of electric charge Q stored by the ferroelectric capacitor $C_F$. Due to the hysteresis characteristic of the ferroelectric capacitor, current passing through the capacitor is changed by the history of the voltage applied thereto. For example, assuming that state B corresponds to data "1" and state D corresponds to data "0", the state of the ferroelectric capacitor can be transferred from state B to state C and then to state D by application of a negative voltage pulse across the first and second electrodes (e.g., positive voltage to the plate line PL relative to the bit line BL when the access transistor Tr is turned-on). During this transition, the electric charge amount $Q_R$ accumulated in the ferroelectric capacitor is changed to $-Q_R$. Accordingly, the total change in the accumulated charge becomes $-2Q_R$, which means the voltage of the bit line BL is changed as shown in formula (1):

$$\Delta V_{BL} = 2Q_R/C_{BL} \tag{1}$$

However, in the event the ferroelectric capacitor is initially in state D corresponding to data "0", and then a negative voltage pulse is applied, the ferroelectric capacitor will sweep from state D to state C and then back to state D, so any change in the potential of the bit line will essentially be negligible.

Now, assuming that an initial state of the ferroelectric capacitor is state D, if the voltage applied to the ferroelectric capacitor is increased, the state of the ferroelectric capacitor will transition from state D towards state A. If the intensity of the positive voltage applied to the ferroelectric capacitor is increased beyond a coercive voltage, the state of the ferroelectric capacitor will change from state D to state A. The removal of the positive voltage from a ferroelectric capacitor in state A will cause the capacitor to transition from state A to state B. Finally, if the voltage applied to a ferroelectric capacitor in state B is made sufficiently negative, the state of the ferroelectric capacitor will transition to state C. The removal of the negative voltage from a ferroelectric capacitor in state C will then cause the capacitor to transition from state C back to state D.

The polarization switching speed of a ferroelectric capacitor is approximately $10^{-9}$ sec, and the necessary program time of the ferroelectric capacitor is typically shorter than that of other nonvolatile memory devices such as electrically programmable read only memory (EPROM) devices, electrically erasable and programmable read only memory (EEPROM) devices and flash memory devices. As will be understood by those skilled in the art, the read/write cycle endurance of a ferroelectric capacitor is typically on the order of $10^9$ to $10^{12}$.

Techniques for reading data from and writing data to FRAM devices are disclosed in U.S. Pat. Nos. 4,873,664 to Eaton Jr., entitled "Self-Restoring Ferroelectric Memory"; U.S. Pat. No. 5,373,463 to Jones Jr., entitled "Ferroelectric Nonvolatile Random Access Memory Having Drive Line Segments"; U.S. Pat. No. 5,608,667 to Osawa, entitled "Ferroelectric Memory Automatically Generating Biasing Pulse for Plate Electrode"; U.S. Pat. No. 5,640,030 to Kenney, entitled "Double Dense Ferroelectric Capacitor Cell Memory"; and U.S. Pat. No. 5,751,626 to Seyyedy, entitled "Ferroelectric Memory Using Ferroelectric Reference Cells". For example, U.S. Pat. No. 5,608,667 to Osawa discloses a FRAM device which utilizes a pulse generator 2a to automatically generate a plate line pulse signal having a predetermined pulse width, after enabling a word line potential. At FIGS. 3–4 and the accompanying text, the '667 patent to Osawa also discloses the application of a plate line pulse signal having a magnitude of Vcc (i.e., the power supply potential) during both reading and writing operations.

Unfortunately, the use of a plate line pulse signal having a magnitude ($V_P$) equal to Vcc during an operation to read the state of a ferroelectric memory cell may increase the likelihood of a reading error if the potential of the bit line BL is not significantly boosted. For example, assuming the magnitude of the plate line pulse signal is Vcc, then by voltage division the voltage $V_F$ that may appear across the ferroelectric capacitor during a read operation may be expressed as:

$$V_F = V_P(1-(C_F/(C_F+C_{BL}))) \quad (2)$$

However, if the magnitude of $V_F$ is insufficient to enable a complete charge transfer of $2Q_R$ when the memory cell is storing a data 1 value, errors may occur when sensing a potential of the bit line BL during a reading operation. Thus, notwithstanding the above-described FRAM devices, there continues to be a need for improved FRAM devices which are less susceptible to reliability failures caused by reading errors, for example.

SUMMARY OF THE INVENTION

It is therefore an object of the present invention to provide improved integrated circuit memory devices and methods of operating same.

It is another object of the present invention to provide nonvolatile integrated circuit memory devices having reduced susceptibility to reading errors and methods of operating same.

These and other objects, advantages and features of the present invention are provided by integrated circuit memory devices which comprise a plate line, a bit line, a ferroelectric memory cell containing a first access transistor and a first ferroelectric capacitor electrically connected in series between the bit line and the plate line, and a word line electrically connected to a gate electrode of the first access transistor. A row decoder and a preferred plate line pulse generator are also provided to generate a write voltage of first magnitude on the plate line during a write time interval and a read voltage of a second magnitude, greater than the first magnitude, on the plate line during a read time interval. These different magnitudes of the write and read voltage are generated in response to a control signal (CP), so that during a read operation, the magnitude of $V_F$ will be sufficient to enable a complete charge transfer of $2Q_R$ when the ferroelectric memory cell is storing a data 1 value, for example.

According to a preferred aspect of the present invention, the plate line pulse generator comprises a pulse generator, a voltage boosting circuit having an input electrically coupled to an output of the pulse generator and a switch circuit to electrically couple an output of the pulse generator to an output of the plate line pulse generator when the control signal is in a first logic state (during a write operation) and electrically couple an output of the voltage boosting circuit to the output of the plate line pulse generator when the control signal is in a second logic state (during a read operation). The switch circuit may comprise a PMOS transistor electrically connected in series between the output of the plate line pulse generator and the output of the pulse generator and an NMOS transistor electrically connected in series between the output of the plate line pulse generator and the output of the voltage boosting circuit.

The preferred memory device also includes a reference plate line, a reference bit line and a ferroelectric reference cell containing a second access transistor and a second ferroelectric capacitor electrically connected in series between the reference bit line and the reference plate line. A reference word line is also electrically connected to a gate electrode of the second access transistor. The row decoder and preferred plate line pulse generator may also be configured to generate the write voltage of first magnitude on the reference plate line during the write time interval and the read voltage of second magnitude on the reference plate line during the read time interval. Here, the row decoder has outputs electrically coupled to the plate line and the reference plate line and an input electrically coupled to the output of the plate line pulse generator. A sense amplifier is also provided. This sense amplifier has first and second inputs electrically coupled to the bit line and the reference bit line, respectively.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols.

Figure 1:
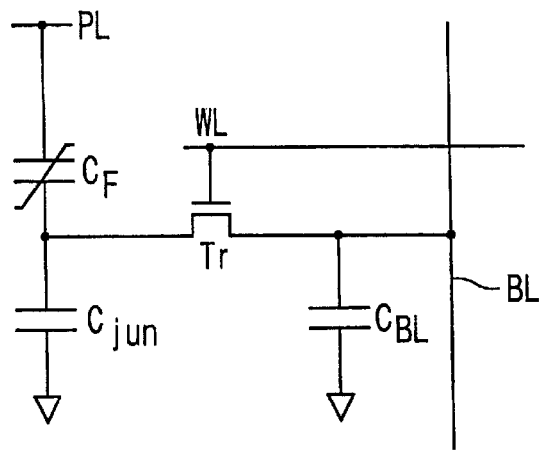
FIG. 1 is an electrical schematic of a conventional ferroelectric memory cell.
Figure 2:
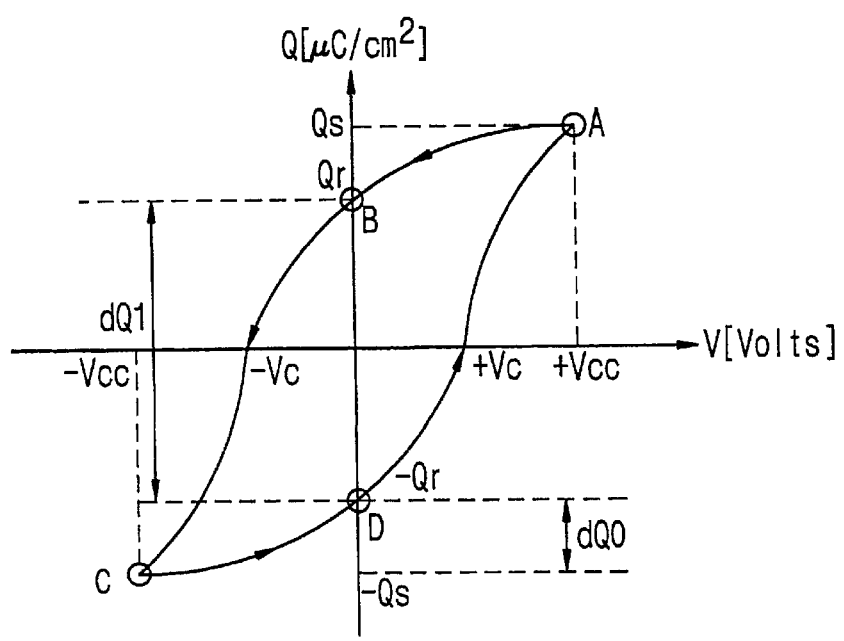
FIG. 2 is characteristic hysteresis curve for a ferroelectric capacitor.
Figure 3:
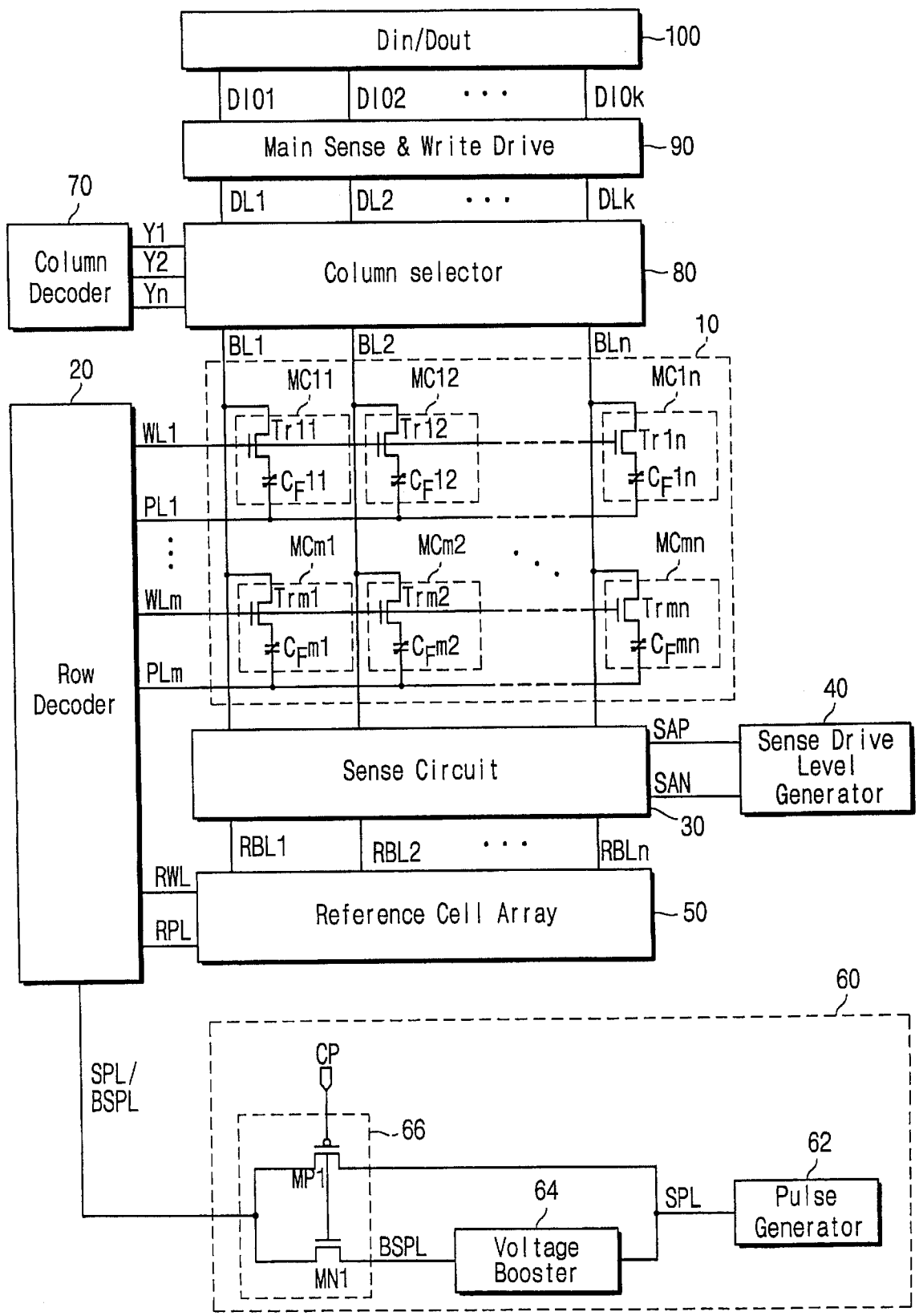
FIG. 3 is a block diagram of a nonvolatile integrated circuit memory device according to a preferred embodiment of the present invention.

Referring now to FIG. 3, a block diagram of a nonvolatile integrated circuit memory device according to a preferred embodiment of the present invention will be described. This nonvolatile memory device includes an array 10 of ferroelectric memory cells $MC_{11}$–$MC_{mn}$. Each of the ferroelectric memory cells includes a respective access transistor and a respective ferroelectric capacitor from the plurality of access transistors $Tr_{11}$–$Tr_{mn}$ and the plurality of ferroelectric capacitors $CF_{11}$–$CF_{mn}$. As illustrated, the array 10 of memory cells may be arranged as a plurality of rows and columns of memory cells with each column of memory cells being electrically coupled to a respective bit line in the plurality of bit lines BL1–BLn and each row of memory cells being electrically coupled to respective word and plate lines in the plurality of word lines WL1–WLm and the plurality of plate lines PL1–PLm. These plurality of word lines WL1–WLm and plate lines PL1–PLm are electrically coupled to a row decoder 20 and are driven by the row decoder 20 during reading and writing operations.

The bit lines BL1–BLn may be selectively enabled by a column selector circuit 80. This column selector circuit 80 is electrically connected to a column decoder 70 which generates a plurality of column select signals on a plurality of column select signal lines Y1–Yn. Data may also be provided to and received from a main sense and write driver circuit 90, via a plurality of data lines DL1–DLk. A data input/output buffer 100 is also provided and is electrically connected to the main sense and write driver circuit 90 by a plurality of data lines DIO1–DIOk.

The plurality of bit lines BL1–BLn are also electrically connected to a sense circuit 30 which may contain a plurality of sense amplifiers of conventional design. The sense circuit 30 is responsive to sense drive signals SAP and SAN which are generated by a sense drive level generator 40. The sense circuit 30 also has inputs electrically connected to an array 50 (e.g., row) of ferroelectric reference cells by a plurality of reference bit lines RBL1–RBLn. Each of the ferroelectric reference cells in the array 50 may comprise an access transistor and a ferroelectric capacitor, like the memory cells in the array 10 of ferroelectric memory cells $MC_{11}$–$MC_{mn}$. Accordingly, the gate electrodes of the access transistors in a row of ferroelectric reference cells may be electrically coupled together and to the row decoder by a reference word line RWL and the ferroelectric capacitors in the row of ferroelectric reference cells may have electrodes which are electrically coupled together and to the row decoder by a reference plate line RPL.

Additional descriptions of the operation of many of the above-described components of the illustrated ferroelectric memory device, including the use of reference cells and sense amplifiers to facilitate reading and writing operations, can be found in U.S. application Ser. No. 08/947,607, entitled "Ferroelectric Memory Devices Having Nondestructive Read Capability and Methods of Operating Same", now U.S. Pat. No. 5,835,400; U.S. application Ser. No. 08/932,729, entitled "Ferroelectric Memory Devices Having Reconfigurable Bit Lines and Methods of Operating Same", now U.S. Pat. No. 5,978,250; and U.S. application Ser. No. 09/098,485, entitled "Ferroelectric Memory Devices Having Linear Reference Cells Therein and Methods of Operating Same", now U.S. Pat. No. 5,968,982, assigned to the present assignee, the disclosures of which are hereby incorporated herein by reference.

Conventional operations for writing data to and reading data from a first ferroelectric memory cell $MC_{11}$ will now be described. In particular, the writing of a logic 1 or logic 0 data value into the first memory cell $MC_{11}$ may be performed by having the column selector 80 drive the first bit line BL1 to a logic 1 or logic 0 potential. An operation is also performed to apply a logic 1 potential (e.g., a power supply potential Vcc, or Vcc+α) to the first word line, to turn on the first access transistor $Tr_{11}$ and thereby electrically connect the first and second electrodes of the first ferroelectric capacitor $CF_{11}$ to the first bit line BL1 and to the first plate line PL1, respectively. A logic 1 pulse having a magnitude equal to Vcc is then applied to the first plate line PL1 to enable the storage of a logic 0 data value in the first cell $MC_{11}$, in the event the first bit line BL1 is at a logic 0 potential. The logic 1 pulse on the first plate line PL1 of relatively short duration also enables the storage of a logic 1 data value in the event the first bit line BL1 is at a logic 1 potential.

The reading of data from the first memory cell $MC_{11}$ may also include the steps of precharging the first bit line BL1 to a logic 0 potential and then allowing the first bit line to float electrically while a logic 1 word line potential and a logic 1 pulse are applied to the first word line WL1 and the first plate line PL1, respectively. If the first memory cell $MC_{11}$ is storing a logic 1 data value, then these operations will result in the transfer of a significant amount of charge to the first bit line BL1 and thereby raise the potential of the first bit line BL1. The potential of the first bit line BL1 can then be compared against the potential $V_{ref}$ (0<$V_{ref}$<Vcc) of a reference bit line RBL1 by a sense amplifier in the sense circuit 30. The sense amplifier will then drive the first bit line BL1 and the first reference bit line RBL1 rail-to-rail to a logic 1 potential and a logic 0 potential, respectively. However, if the first memory cell $MC_{11}$ is storing a logic 0 data value, then these operations may result in the transfer of an insignificant amount of charge to the first bit line BL1. The potential of the first bit line BL1 can then be compared against the potential $V_{ref}$ of the reference bit line RBL1 by the sense amplifier in the sense circuit 30. The sense amplifier will then drive the first bit line BL1 and the first reference bit line RBL1 rail-to-rail to a logic 0 potential and a logic 1 potential, respectively.

According to a preferred aspect of the present invention, however, the reliability of the above-described conventional reading operations can be improved with respect to the first memory cell $MC_{11}$ by boosting the potential of the pulse applied to the first plate line PL1 to a level greater than Vcc (e.g., Vcc+β) so that a greater amount of charge can be transferred to the first bit line BL1 when the first memory cell $MC_{11}$ is storing a logic 1 data value. This transfer of a greater amount of charge to the first bit line BL1 will increase the likelihood that the sense and amplify operations performed by the sense circuit 30 will be performed accurately.

Figure 4:
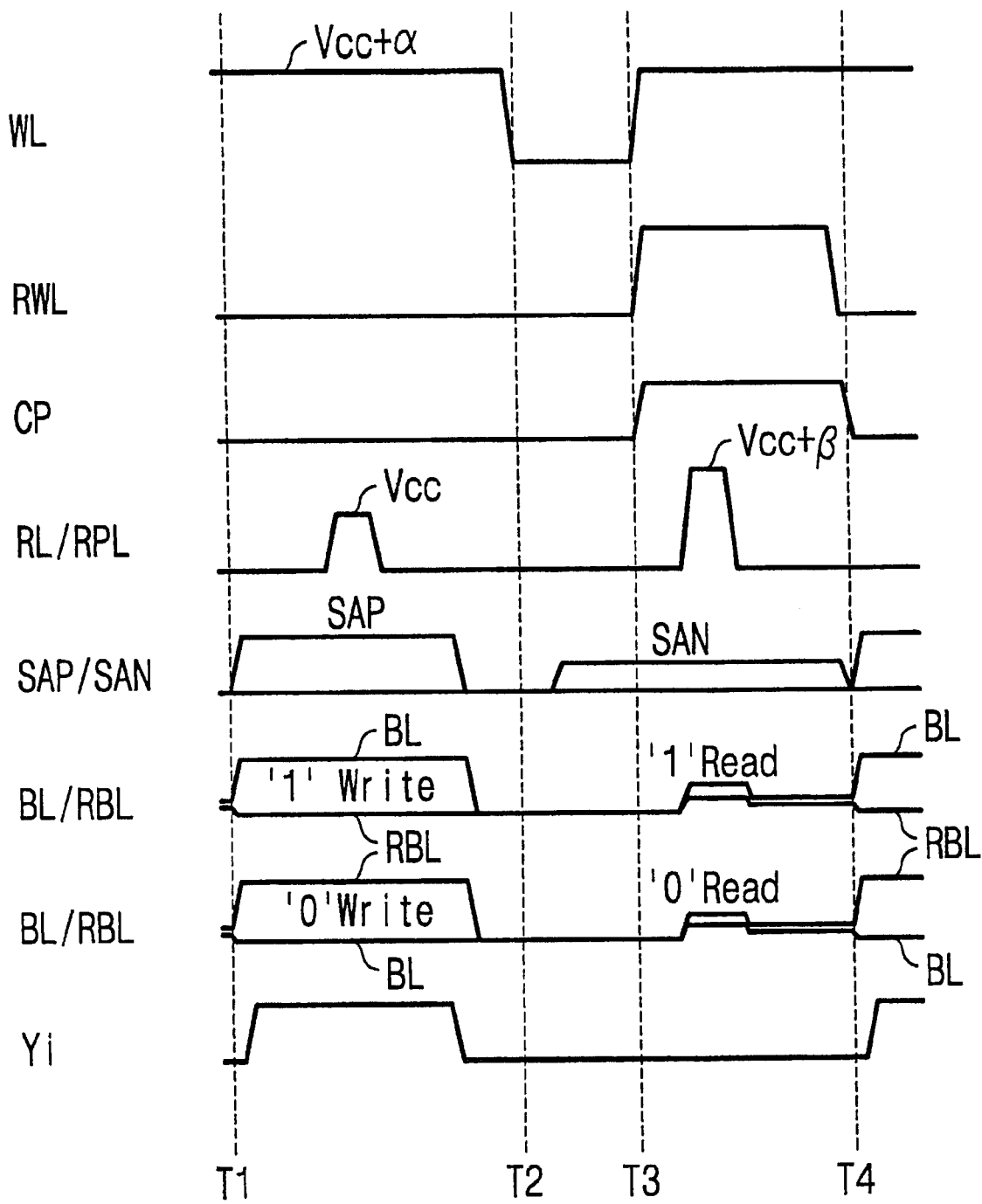
FIG. 4 is a timing diagram which illustrated operation of the memory device of FIG. 3.

As illustrated by the timing diagram of FIG. 4, the writing of a logic 1 or logic 0 data value into the first memory cell $MC_{11}$ may be performed during time interval T1–T2 by having the column selector 80 drive the first bit line BL1 to a logic 1 or logic 0 potential. An operation is also performed to apply a logic 1 potential (Vcc+α) to the first word line to turn on the first access transistor $Tr_{11}$ and thereby electrically connect the first and second electrodes of the first ferroelectric capacitor $CF_{11}$ to the first bit line BL1 and to the first plate line PL1, respectively. A logic 1 pulse having a magnitude equal to Vcc is then applied to the first plate line PL1 to enable the storage of a logic 0 data value in the first cell $MC_{11}$, in the event the first bit line BL1 is at a logic 0 potential. Because the duration of the logic 1 pulse to the plate line PL1 is relatively short compared to the duration of the signal applied to the first bit line BL1, a logic 1 data value can be stored in the first cell $MC_{11}$ if the first bit line BL1 is set to a logic 1 potential during the time interval T1–T2.

The reading of data from the first memory cell $MC_{11}$ during time interval T3–T4 preferably includes the steps of precharging the first bit line BL1 to a logic 0 potential and then allowing the first bit line to float electrically while a logic 1 word line potential (Vcc+α) and a logic 1 pulse are applied to the first word line WL1 and the first plate line PL1, respectively. Here, the magnitude of the logic 1 pulse applied to the first plate line PL1 is greater than Vcc (e.g., Vcc+β) so that a greater amount of charge can be transferred to the first bit line BL1 when the first memory cell $MC_{11}$ is storing a logic 1 data value. The potential of the first bit line BL1 can then be compared against the potential $V_{ref}$ (0<$V_{ref}$<Vcc) of a reference bit line RBL1 by a sense amplifier in the sense circuit 30. Commencing at time T4, the sense amplifier will then drive the first bit line BL1 and the first reference bit line RBL1 rail-to-rail to a logic 1 potential and a logic 0 potential, respectively. However, if the first memory cell $MC_{11}$ is storing a logic 0 data value, then these reading operations may result in the transfer of an insignificant amount of charge to the first bit line BL1. The potential of the first bit line BL1 can then be compared against the potential $V_{ref}$ of the reference bit line RBL1 by the sense amplifier in the sense circuit 30. Commencing at time T4, the sense amplifier will then drive the first bit line BL1 and the first reference bit line RBL1 rail-to-rail to a logic 0 potential and a logic 1 potential, respectively.

Referring again to FIG. 3, the boosted plate line potential of Vcc+β is preferably provided by plate line pulse generator 60 during reading operations but not during writing operations. As illustrated, this plate line pulse generator 60 comprises a pulse generator 62 (to generate pulses having a magnitude of Vcc), a voltage boosting circuit 64 having an input electrically coupled to an output of the pulse generator 62 and a switch circuit 66 to electrically couple an output of the pulse generator 62 to an output of the plate line pulse generator 60 (SPL/BSPL) when the control signal CP is in a first logic state (e.g., logic 0) and electrically couple an output of the voltage boosting circuit 64 to the output of the plate line pulse generator 60 when the control signal CP is in a second logic state (e.g., logic 1). Here, the switch circuit 66 comprises a PMOS transistor MP1 and an NMOS transistor MN1 and the voltage boosting circuit 64 generates a pulse having a magnitude of Vcc+β which can be transferred by the row decoder 20 to the plate lines (PL1–PLn, RPL) during reading operations.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
    a plate line;
    a bit line;
    a ferroelectric memory cell comprising a first access transistor and a first ferroelectric capacitor electrically connected in series between said bit line and said plate line;
    a word line electrically connected to a gate electrode of the first access transistor; and
    means, electrically coupled to said plate line and responsive to a control signal, for generating a write voltage having a maximum first magnitude on said plate line during a write time interval and a read voltage having a maximum second magnitude, greater than the maximum first magnitude, on said plate line during a read time interval.

2. An integrated circuit memory device, comprising:
    a plate line;
    a bit line;
    a ferroelectric memory cell comprising a first access transistor and a first ferroelectric capacitor electrically connected in series between said bit line and said plate line;
    a word line electrically connected to a gate electrode of the first access transistor; and
    means, electrically coupled to said plate line and responsive to a control signal, for generating a write voltage having a first magnitude on said plate line during a write time interval and a read voltage having a second magnitude, greater than the first magnitude, on said plate line during a read time interval;
    wherein said generating means comprises a plate line pulse generator, said plate line pulse generator comprising:
        a pulse generator;
        a voltage boosting circuit having an input electrically coupled to an output of said pulse generator; and
        a switch circuit to electrically couple an output of said pulse generator to an output of said plate line pulse generator when the control signal is in a first logic state and electrically couple an output of said voltage boosting circuit to the output of said plate line pulse generator when the control signal is in a second logic state, opposite the first logic state.

3. The memory device of claim 2, further comprising:
    a reference plate line;
    a reference bit line;
    a ferroelectric reference cell containing a second access transistor and a second ferroelectric capacitor electrically connected in series between said reference bit line and said reference plate line;
    a reference word line electrically connected to a gate electrode of the second access transistor; and
    wherein said generating means comprises means for generating the write voltage of first magnitude on said reference plate line during the write time interval and the read voltage of second magnitude on said reference plate line during the read time interval.

4. The memory device of claim 3, further comprising a row decoder having outputs electrically coupled to said plate line and said reference plate line and an input electrically coupled to the output of said plate line pulse generator.

5. The memory device of claim 4, wherein said switch circuit comprises:
    a PMOS transistor electrically connected in series between the output of said plate line pulse generator and the output of said pulse generator; and
    an NMOS transistor electrically connected in series between the output of said plate line pulse generator and the output of said voltage boosting circuit.

6. The memory device of claim 5, further comprising a sense amplifier having first and second inputs electrically coupled to said bit line and said reference bit line, respectively.

7. An integrated circuit memory device, comprising:
    a plurality of plate lines;
    a plurality of bit lines;
    an array of ferroelectric memory cells, each of the memory cells in said array thereof comprising an access transistor and a ferroelectric capacitor electrically connected in series between a corresponding bit line and a corresponding plate line;
    a plurality of word lines electrically connected to gate electrodes of the access transistors in said array of ferroelectric memory cells;
    a plate line pulse generator which generates a write plate line voltage of first magnitude at an output thereof during a write time interval and generates a read plate line voltage of a second magnitude, greater than the first magnitude, at the output during a read time interval; and
    a row decoder to drive said plurality of plate lines and said plurality of word lines and electrically couple the output of said plate line pulse generator to a plate line in the plurality thereof during the read and write time intervals.

8. The memory device of claim 7, wherein said generating means comprises a plate line pulse generator, comprises:
    a pulse generator;
    a voltage boosting circuit having an input electrically coupled to an output of said pulse generator; and
    a switch circuit to electrically couple an output of said pulse generator to an output of said plate line pulse generator when the control signal is in a first logic state and electrically couple an output of said voltage boosting circuit to the output of said plate line pulse generator when the control signal is in a second logic state, opposite the first logic state.

9. The memory device of claim 8, wherein said switch circuit comprises:
   a PMOS transistor electrically connected in series between the output of said plate line pulse generator and the output of said pulse generator; and
   an NMOS transistor electrically connected in series between the output of said plate line pulse generator and the output of said voltage boosting circuit.

10. A method of operating a ferroelectric memory device, comprising the steps of:
   driving a plate line of a ferroelectric memory cell with a plate line voltage having a maximum first magnitude, during a write time interval;
   driving the plate line of the ferroelectric memory cell with a plate line voltage having a maximum second magnitude, greater than the maximum first magnitude, during a read time interval; and
   sensing a potential of a bit line electrically coupled to the ferroelectric memory cell during the read time interval.

11. A method of operating a ferroelectric memory device, comprising the steps of:
   driving a plate line of a ferroelectric memory cell with a plate line voltage of a first magnitude, during a write time interval;
   driving the plate line of the ferroelectric memory cell with a plate line voltage of a second magnitude, greater than the first magnitude, during a read time interval;
   sensing a potential of a bit line electrically coupled to the ferroelectric memory cell during the read time interval;
   driving a reference plate line of a ferroelectric reference cell with a reference plate line voltage of the first magnitude, during the write time interval;
   driving the reference plate line of the ferroelectric memory cell with a reference plate line voltage of the second magnitude, during the read time interval;
   sensing a potential of a reference bit line electrically coupled to the ferroelectric reference cell during the read time interval; and
   amplifying a difference in potential between the sensed potential of the bit line and the sensed potential of the reference bit line.

* * * * *